(12) United States Patent
Boulanger et al.

(10) Patent No.: US 8,450,596 B2
(45) Date of Patent: May 28, 2013

(54) SOLAR GENERATOR PANEL AND AN ASSOCIATED SATELLITE

(75) Inventors: Bernard Boulanger, Frejus (FR); Hubert Delclos, Roquefort les Pins (FR)

(73) Assignee: Thales, Neuilly sur Seine (FR)

( * ) Notice: Subject to any disclaimer, the term of this patent is extended or adjusted under 35 U.S.C. 154(b) by 2137 days.

(21) Appl. No.: 10/941,831

(22) Filed: Sep. 16, 2004

(65) Prior Publication Data

US 2005/0133079 A1 Jun. 23, 2005

(30) Foreign Application Priority Data

Dec. 23, 2003 (FR) ..................................... 03 15227
Feb. 2, 2004 (FR) ..................................... 04 50181

(51) Int. Cl.
*H01L 31/045* (2006.01)

(52) U.S. Cl.
CPC .................................. *H01L 31/045* (2013.01)
USPC ........................................................ 136/244

(58) Field of Classification Search
USPC ................................................ 136/244, 292
See application file for complete search history.

(56) References Cited

U.S. PATENT DOCUMENTS

| | | | |
|---|---|---|---|
| 3,833,426 A | * | 9/1974 | Mesch .......................... 136/244 |
| 4,232,070 A | * | 11/1980 | Inouye et al. ................... 428/49 |
| 4,350,836 A | | 9/1982 | Crouthamel et al. |
| 5,021,099 A | | 6/1991 | Kim et al. |
| 6,331,671 B1 | * | 12/2001 | Makita et al. ................. 136/244 |
| 6,407,327 B1 | * | 6/2002 | Ralph et al. ................... 136/244 |

FOREIGN PATENT DOCUMENTS

| | | |
|---|---|---|
| DE | 296 11 082 U1 | 8/1996 |
| JP | 10 12909 A | 1/1998 |
| JP | 10-154822 A | 6/1998 |

OTHER PUBLICATIONS dictionary.com, definition of "through", 1 [accessed Aug. 1, 2008].*
dictionary.com, definition of "via", 1 [accessed Aug. 1, 2008].*
Stella P M et al: "Thin Film Gaas for Space-Moving Out of the Laboratory" Proceedings of The Photovoltaic Specialists Conference. Louisville, May 10-14, 1993, New York, IEE, US, vol. Conf. 23, May 10, 1993, pp. 21-26, XP010113309.
R.V. Elms "Solar arrays for space station and platforms" $21^{st}$ Instersociety Energy Conversion Engineering Conference, Aug. 25, 1986, pp. 1898-1902, XP002294528.

* cited by examiner

*Primary Examiner* — Miriam Berdichevsky
(74) *Attorney, Agent, or Firm* — Baker Hostetler LLP

(57) ABSTRACT

A solar generator panel comprising a plane array of strings of photovoltaic cells disposed side by side. According to the invention, the cells have cropped corners suitable for generating free spaces in the interstices between the cropped corners. It is then possible to place openings in those spaces for passing cables and/or for receiving damper blocks. The invention is particularly applicable to solar panels for satellites.

5 Claims, 4 Drawing Sheets

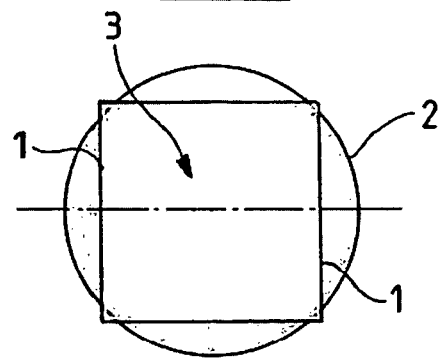
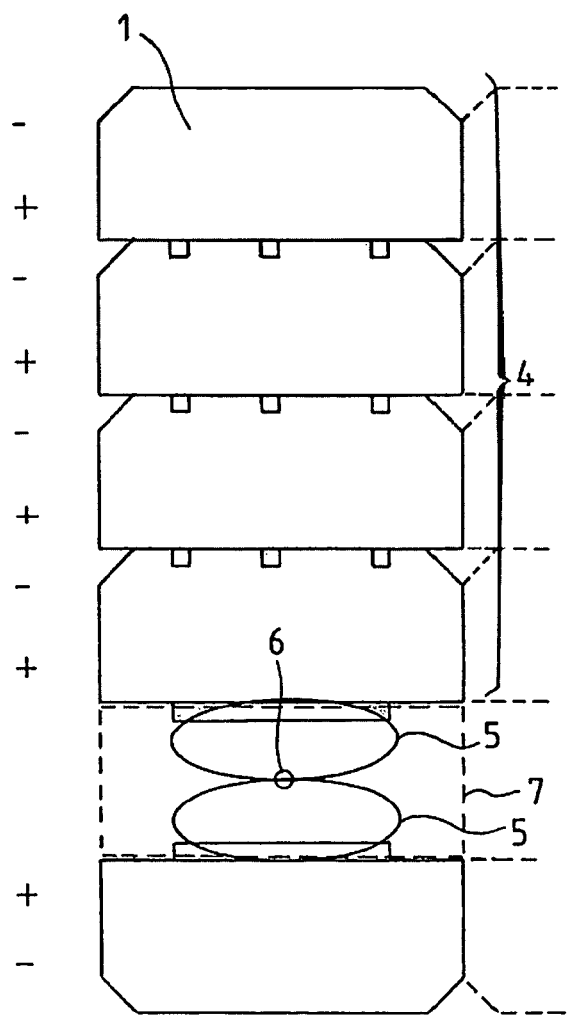

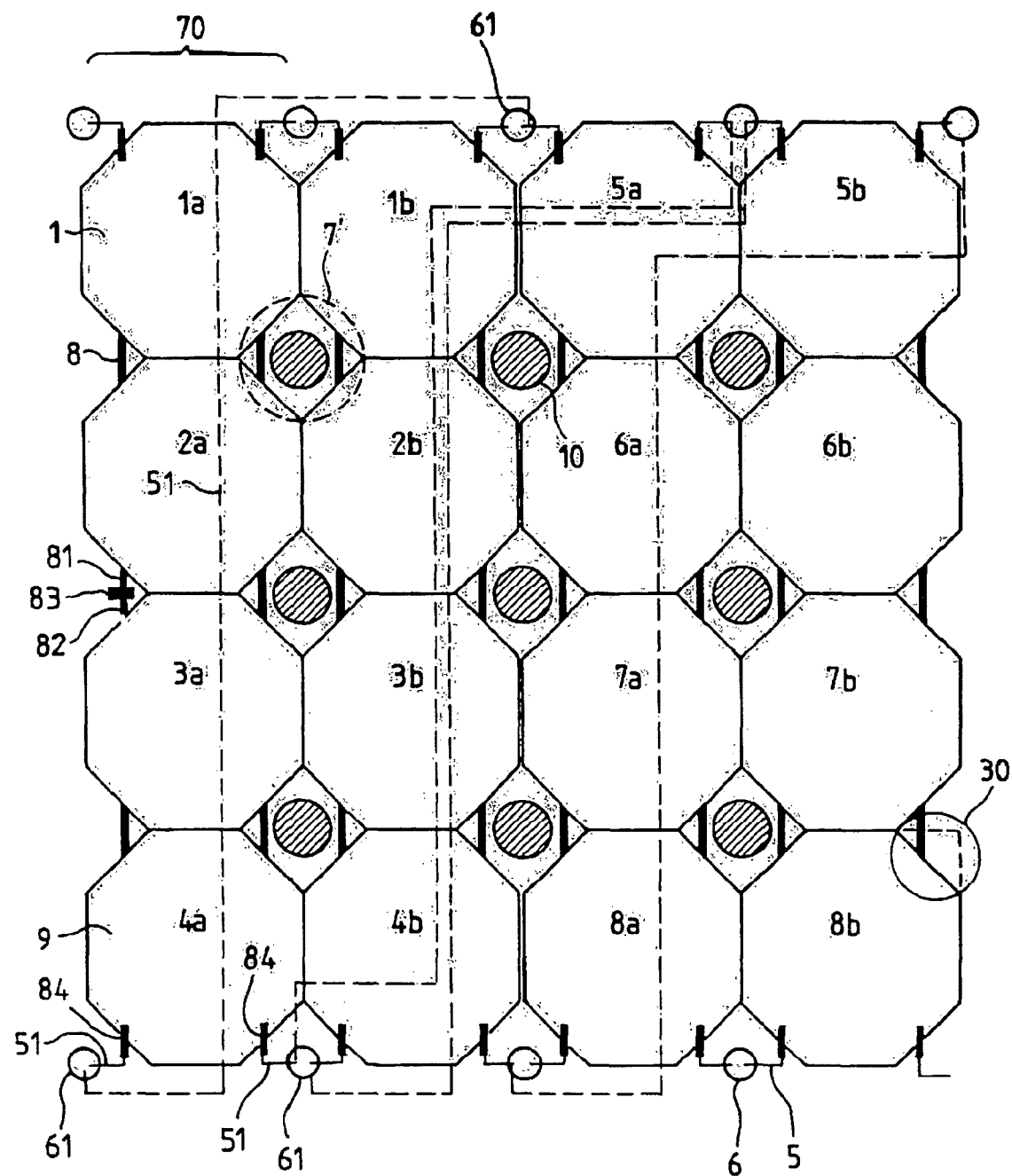
FIG_3

FIG_4
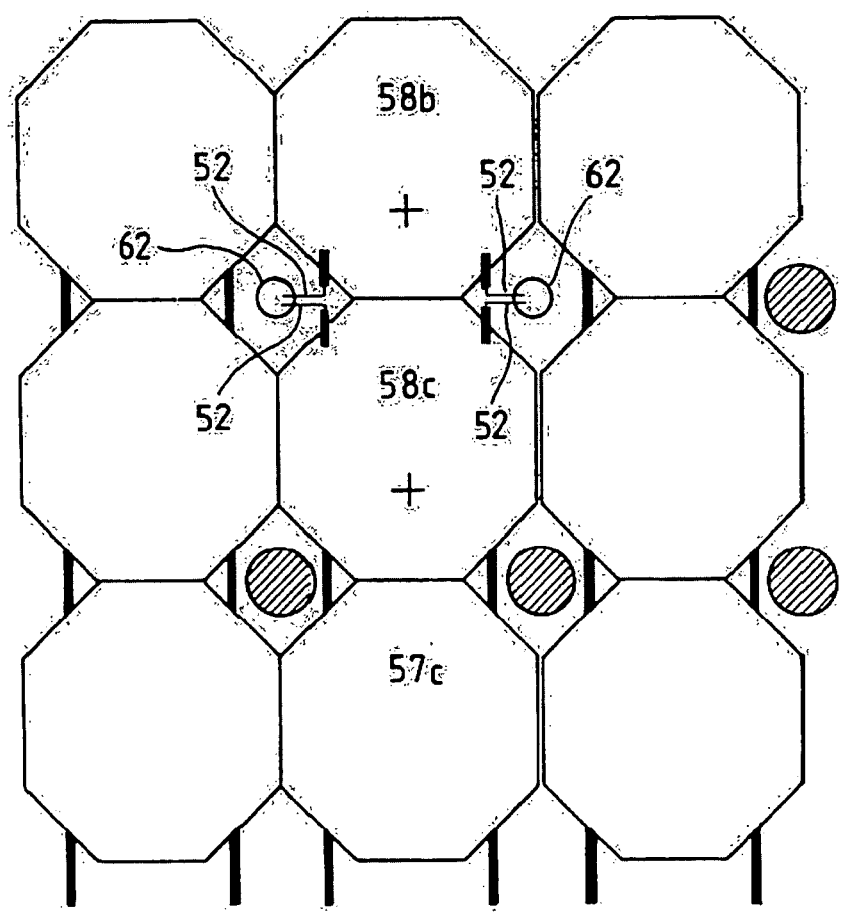

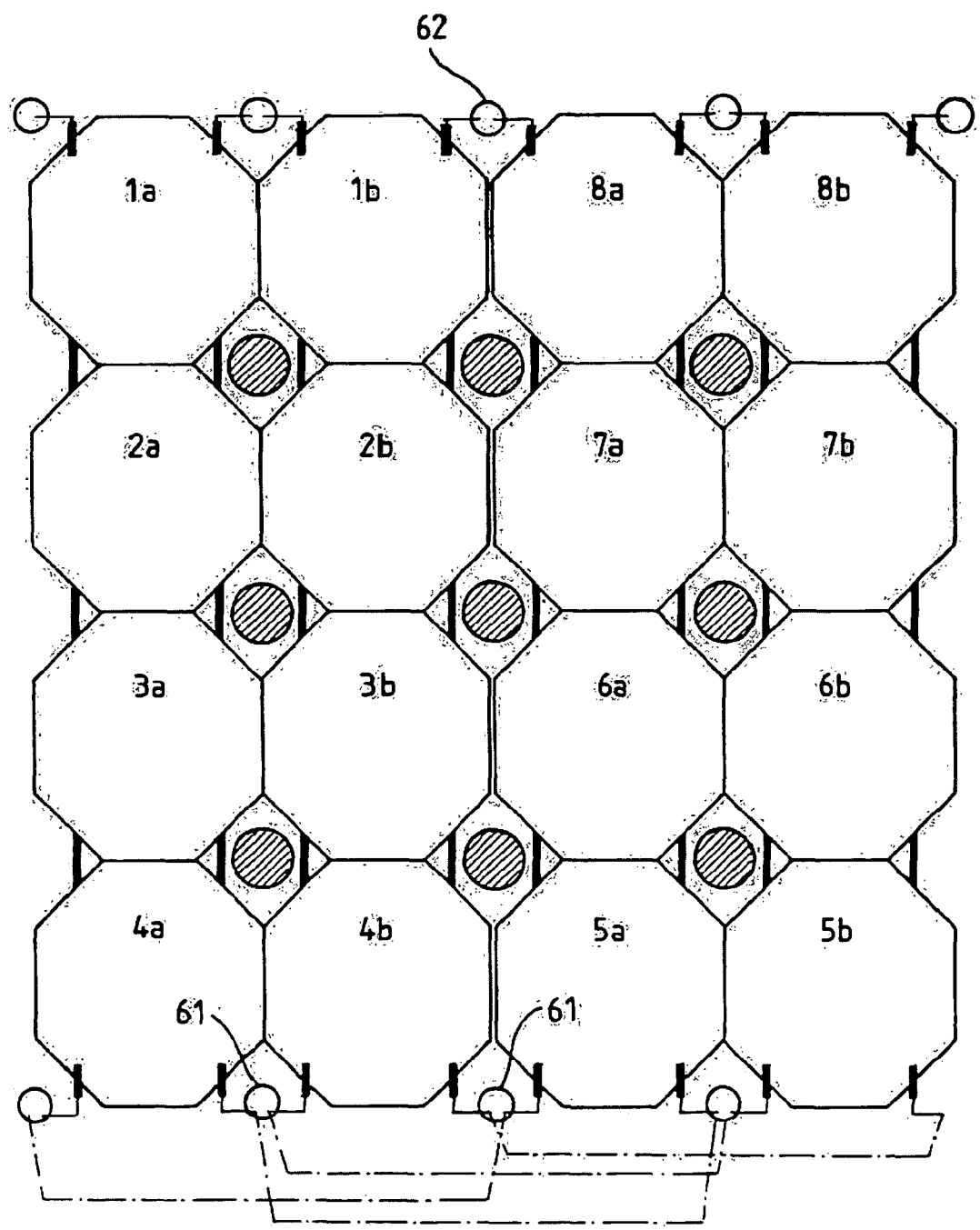
FIG_5

SOLAR GENERATOR PANEL AND AN ASSOCIATED SATELLITE

BACKGROUND OF THE INVENTION

The present invention relates in general manner to the field of solar energy generator panels, in particular for space applications. More particularly, it relates to a solar generator panel comprising an array of strings of photovoltaic cells disposed side by side and forming a substantially rectangular grid.

The solar generator panels transported in a space vehicle such as a satellite generally comprise:
- an array of solar cells formed by strings of cells electrically connected to the satellite, the array covering the surface of support panels and serving to transform solar energy into electrical energy; and
- said support panels supporting the arrays of cells comprising a substrate.

Such solar generator panels can be distributed in a wide variety of configurations. Conventionally, they comprise a longitudinal succession extending parallel to a direction going away from the body of the space vehicle, and around which the generator panel is designed to turn in order to track the sun. Nevertheless, in order to increase the available electrical power, proposals have been made to deploy not only the above panels, but also additional lateral panels. Configurations are also known in which the panels are disposed in a transverse direction, i.e. in a direction extending transversely to the above-mentioned longitudinal direction along which the yoke extends that connects the generator to the body of the satellite, and about which the generator is adapted to turn in order to track the sun.

Another factor for increasing the electrical power available from panels lies in the occupancy ratio of solar cells over the panel. It is common practice to use silicon cells which enable an occupancy ratio of up to 0.94 to be achieved, which is deemed to be excellent. Naturally, this excellent result comes from the small number of strings per panel, which is a characteristic of strings of silicon cells, leading to only a small area being lost.

Nevertheless, the present trend is more and more towards the use of GaAs cells since they provide high energy conversion efficiency.

Nevertheless, several drawbacks arise when it comes to using GaAs cells:
- firstly, it is necessary to find a solution to connecting the positive and negative terminals of the strings of cells, which solution must be capable of optimizing the space occupied by the terminals;
- secondly, it is known that if the voltage between adjacent cells is above a certain threshold, then the working current from the string can flow between two cells via a plasma created by a primary electrostatic discharge. This secondary arc sustained by the working current of the generator can be maintained for several seconds or more. It is then found that the secondary arc dissipates sufficient energy to heat the insulating substrate, up to a temperature where the high resistance polymer becomes transformed into a material having very low resistance. This process of pyrolysis leads to a permanent short circuit between the two cells, and thus between two rows of adjacent cells, which leads to permanent destruction of a portion of the solar generator, which then becomes incapable of delivering all of its working power to the equipment of the satellite.

For panels in which the + and − terminals of the strings of cells are on the same edge of the panel, usually referred to as being a U-shaped configuration, two + and − terminals which are associated with the same U-shape are relatively close together and at a potential difference equal to the total voltage drop along the corresponding string. Thus, the maximum potential difference appears between these successive terminals and between two contiguous cells which are each respective ends of the same U-shaped string. As a result of the small distance between the cells (or the terminals) associated with a high potential difference, there is a risk of an electric arc appearing, as explained above.

That is why it is necessary to set a maximum voltage between adjacent cells (of about 40 volts (V)).

Furthermore, a method of reducing the risks of secondary discharge between adjacent rows lies in increasing the spacing between rows of cells. Nevertheless, the spacing created in this way leads to a reduction in the cell occupancy ratio of the panel, thereby decreasing the solar energy power that the panel can collect. In the present state of knowledge, the occupancy ratio of GaAs cells reaches a maximum in the range 0.90 to 0.92. This ratio is achieved in particular by using cells obtained by the method as shown in FIG. 1 whereby cells 1 are cut from disks 2 of germanium (Ge), where said disks are commonly referred to as "wafers", which means that corners are cropped between adjacent cells 1. The supply of the cells 1 have taken the habit of cutting the square 3 into two in order to provide two rectangular cells each having two chamfered corners, both cells being taken from the same disk 2.

FIG. 2 shows strings 4 of cells of the kind that have been used until now. The string 4 is constituted by solar cells 1 connected in pairs in series, thus forming a row of cells. The ends of the string 4, which can be located on the same row or on different rows, are each connected to a + or − terminal of the panel so that the electric current delivered by each string is collected by wiring 5 and taken, via dedicated openings 6 and cabling installed on the rear face, to the equipment of the satellite. However, the area 7 dedicated to the cables 5, to their connections to the end cells, and to the connection opening generally corresponds to the area occupied by one cell, or even more, thereby considerably decreasing the occupancy ratio of the panel.

SUMMARY OF THE INVENTION

An object of the invention is thus to provide a solar generator panel comprising a plane array of strings of solar cells and which solves the above-mentioned drawbacks by making it possible to reduce the area lost for connections between the satellite and the terminals of the strings, and also making it possible to reduce the risks of voltage differences between adjacent cells.

To this end, the present invention provides a solar generator panel comprising an array of strings of photovoltaic cells disposed side by side and substantially forming a grid on a "front", first face of the panel, said cells being electrically interconnected to form a plurality of independent strings, each string being made up of cells connected in series in pairs forming rows of mutually parallel cells, two successive rows in a string being electrically interconnected at their ends via connection means that pass through the panel via first openings and that are laid on its rear face, each string comprising positive terminals and negative terminals, said positive and negative terminals being distributed along each string and over the structure of the panel so that the positive terminals are remote from the negative terminals so as to reduce the risk of an electric arc appearing between two terminals, each end cell of a string being connected to at least one electrical energy collector cable passing via at least one respective opening for bringing together collector cables and referred to as a "second" opening, the panel being characterized in that the cells are square or rectangular in area and are cropped at their four corners, the arrangement of the cells having cropped corners in the form of a grid causing small free spaces to appear in the interstices between the cropped corners of adjacent cells, in which spaces there are created the first openings and the second openings for bringing together the collector cables, which cables are directed thereto.

In an embodiment, at least one inter-panel damping block is disposed in at least one of said free spaces in the interstices between the cropped corners of adjacent cells.

In an embodiment, the cells are fabricated using a method of cutting a Ge wafer.

In an embodiment, the electrical connections between two successive adjacent cells in any one string are made at the rear face of one of the cells close to at least one of its cropped corners.

The invention also provides a satellite characterized in that it includes a solar generator panel of the invention.

BRIEF DESCRIPTION OF THE DRAWINGS

Other characteristics and advantages of the invention will appear more clearly on reading the following description of particular embodiments with reference to the following figures:

FIG. 1 is a diagram showing the method of cutting out cells;
FIG. 2 shows strings of cells as combined in the prior art;
FIG. 3 shows a plane array of cells in a first embodiment of the invention;
FIG. 4 shows another embodiment of the invention; and
FIG. 5 shows a plane array of octagonal cells constituting a variant of FIG. 3.

DESCRIPTION OF PREFERRED EMBODIMENTS

Below, elements performing functions that are identical or similar are given the same references.

FIG. 3 is a diagram of a plane array 100 of octagonal cells in a first embodiment of the invention.

For better clarity when distinguishing the various strings of cells, only two strings of cells are shown, the first comprising cells referenced 1a to 8a, and the second comprising cells referenced 1b to 8b.

The order in which they are numbered corresponds to the order in which electrical continuity is implemented. Thus, two successive cells in a given string are interconnected by a connection 8. In fact, this connection is made up of two sub-connections 81 and 82, each being secured to one of the two successive cells, and the two sub-connections being bonded to each other at a junction point 83.

The junction point 83 is shown in FIG. 3 with the two sub-connections 81 and 82 being equivalent in length. Nevertheless, in a preferred variant, the cells are assembled in such a manner that the two sub-connections of the first cell extend to under the cell to which they are being assembled and bonded. It will readily be understood that in this preferred variant (not shown), the junction points can be under one of the two cells instead of being halfway between the two cells.

It should be observed that the electrical connections on the front face are represented by continuous lines whereas the connections on the back face are represented by dashed lines. It should also be observed that the junction 83 can be implemented by welding or by any other means known to the person skilled in the art.

As can be seen in FIG. 3, the end cell 4a of the row 70 has sub-connections 84 which are connected by connection wires 51 passing through openings 61 and laid against the back face of the panel, going to the cell 5a via the opening 61 in the free space associated therewith. It should be observed that the cell 5a is on the edge opposite from that of the cell 4a.

As can be seen, the cropped corners 30 of the cells enable an empty space 7' to be established that is small in size and suitable for receiving the connections 8.

These connections in the small space provided in this way also serve, by virtue of the invention, to reduce the voltage differences between adjacent cells.

In addition, in the free spaces that have neither openings for passing collector cables, nor openings enabling two end cells to be interconnected, there are provided inter-panel damping blocks 10. Each of the blocks 10 is stuck to the location represented by a shaded circle and facing the facing circle of the panel with which the present panel is stacked in a direction normal to the planes of the panels. The function of these blocks is to damp and absorb inter-panel shocks during the launch stage and also during the flight stage.

Thus, the invention serves to increase the available area for mounting damping blocks and provides a better distribution thereof, without any need to eliminate cells in order to be able to mount the damping blocks.

FIG. 4 shows an embodiment of the invention in which a end cell 58c of one string is contiguous with another contiguous cell 58b of another string. Cables 52, each connected to one of the terminals of the end cells 58b and 58c, pass via an opening to be directed towards the satellite.

FIG. 5 is a diagram of a plane array of octagonal cells in a variant of FIG. 3.

The connection between two end cells 4a and 4b, or 4b and 5b in any one string takes place via the same edge. As can be seen, the connections nevertheless pass through openings 61 to be laid over the back face of the panel for a portion of their path.

Naturally, the invention is not limited to the embodiments described in the present application.

For example, the invention is not limited to a plane array of strings of cells, but can be applied to cylindrical surfaces having a radius of curvature that is large enough to enable flexible cells to be pressed thereagainst.

The invention claimed is:

1. A solar generator panel comprising an array (100) of strings (4; 1a-8a; 1b-8b) of photovoltaic cells (1) disposed side by side and substantially forming a grid on a "front", first face of the panel, said cells being electrically interconnected to form a plurality of independent strings (4), each string being made up of cells connected in series in pairs forming rows (70) of mutually parallel cells, two successive rows in a string being electrically interconnected at their ends via connection means (51) that, from a connection to one of said two successive rows passes through the panel via a first opening (61) and that are laid on a rear face of said panel and that subsequently pass back through the panel via another first opening to connect to a second of said two rows, each string comprising positive terminals (+) and negative terminals (-), said positive and negative terminals being distributed along each string and over the structure of the panel so that the positive terminals are remote from the negative terminals so as to reduce the risk of an electric arc appearing between two terminals, each end cell (1a, 8a, 1b, 8b) of a string being connected to at least one electrical energy collector cable (52) passing via at least one respective opening for bringing together collector cables and referred to as a "second" opening (62), the panel being characterized in that the cells are square or rectangular in area and are cropped at their four corners (30), the arrangement of the cells having cropped corners in the form of a grid causing small free spaces (7') to appear in the interstices between the cropped corners of adjacent cells, in which spaces there are created the first openings and the second openings for bringing together the collector cables, which cables are directed thereto.

2. A panel according to claim 1, characterized in that at least one inter-panel damping block is disposed in at least one of said free spaces in the interstices between the cropped corners of adjacent cells.

3. A panel according to claim 1, in which the cells are fabricated using a method of cutting a Ge wafer.

4. A panel according to claim 1, in which the electrical connections between two successive adjacent cells in any one string are made at the rear face of one of the cells close to at least one of its cropped corners.

5. A satellite including a solar generator panel according to claim 1.

* * * * *